United States Patent
Han et al.

(10) Patent No.: US 12,320,955 B2
(45) Date of Patent: Jun. 3, 2025

(54) WATER-REPELLENT COATING LENS FOR A CAMERA AND A MANUFACTURING METHOD THEREOF

(71) Applicants: HYUNDAI MOTOR COMPANY, Seoul (KR); KIA CORPORATION, Seoul (KR); SEKONIX CO. LTD., Dongducheon-si (KR)

(72) Inventors: Jai-Min Han, Suwon-si (KR); Byung-Kyu Cho, Hwaseong-si (KR); Kwang-Joon Han, Seongnam-si (KR); Ji-Woong Yeon, Bucheon-si (KR); Jin-Ho Kim, Yongin-si (KR)

(73) Assignees: HYUNDAI MOTOR COMPANY, Seoul (KR); KIA CORPORATION, Seoul (KR); SEKONIX CO. LTD., Dongduccheon-si (KR)

( * ) Notice: Subject to any disclaimer, the term of this patent is extended or adjusted under 35 U.S.C. 154(b) by 35 days.

(21) Appl. No.: 18/223,580

(22) Filed: Jul. 19, 2023

(65) Prior Publication Data
US 2024/0295675 A1     Sep. 5, 2024

(30) Foreign Application Priority Data
Mar. 2, 2023    (KR) ............... 10-2023-0027687

(51) Int. Cl.
*G02B 1/18*       (2015.01)
*C09D 7/63*       (2018.01)
(Continued)

(52) U.S. Cl.
CPC ............... *G02B 1/18* (2015.01); *C09D 7/63* (2018.01); *C09D 127/12* (2013.01);
(Continued)

(58) Field of Classification Search
CPC ............................. G02B 1/18; C09D 127/12
See application file for complete search history.

(56) References Cited

U.S. PATENT DOCUMENTS

| | | | | |
|---|---|---|---|---|
| 2014/0004323 A1* | 1/2014 | Bockmeyer | ........... | C03C 17/001 428/209 |
| 2021/0087430 A1* | 3/2021 | Kishi | ....................... | B05D 5/08 |

(Continued)

FOREIGN PATENT DOCUMENTS

| | | | |
|---|---|---|---|
| JP | 2007155802 A | * | 6/2007 |
| JP | 2015116731 A | * | 6/2015 |
| KR | 20200040020 A | | 4/2020 |

OTHER PUBLICATIONS

JP2007155802A translation (Year: 2007).*
(Continued)

*Primary Examiner* — Cachet I Proctor
(74) *Attorney, Agent, or Firm* — Lempia Summerfield Katz LLC

(57) ABSTRACT

A water-repellent coating lens for a camera has enhanced abrasion resistance performance and chemical resistance performance of the water-repellent coating. The water-repellent coating lens includes a lens base layer and a plurality of coating layers deposited on the lens base layer. The plurality of coating layers include a first water-repellent coating layer containing a fluorine-based compound and a second water-repellent coating layer positioned on the bottom surface of the first water-repellent coating layer and containing an inorganic oxide.

5 Claims, 7 Drawing Sheets

(51) Int. Cl.
*C09D 127/12* (2006.01)
*C23C 14/08* (2006.01)
*C23C 14/10* (2006.01)
*C23C 14/30* (2006.01)
*G02B 1/12* (2006.01)

(52) U.S. Cl.
CPC ............ *C23C 14/088* (2013.01); *C23C 14/10* (2013.01); *C23C 14/30* (2013.01); *G02B 1/12* (2013.01)

(56) References Cited

U.S. PATENT DOCUMENTS

| | | | |
|---|---|---|---|
| 2021/0116608 A1* | 4/2021 | Mizumachi | C03C 17/3417 |
| 2023/0192538 A1* | 6/2023 | McNeil | C03C 17/25 |
| | | | 428/432 |
| 2023/0322616 A1* | 10/2023 | Watanabe | C03C 17/009 |
| | | | 428/336 |

OTHER PUBLICATIONS

JP2015116731A translation (Year: 2015).*
Anwar et al. Structural and optical study of samarium doped cerium oxide thin films prepared by electron beam evaporation. Journal of Alloys and Compounds 509 (2011) 4525-4529 (Year: 2011).*
Kundu et al. Fabrication of catalytically active nanocrystalline samarium (Sm)-doped cerium oxide (CeO2) thin films using electron beam evaporation. J Nanopart Res (2012) 14:1040 (Year: 2012).*

* cited by examiner

WATER-REPELLENT COATING LENS FOR A CAMERA AND A MANUFACTURING METHOD THEREOF

CROSS-REFERENCE(S) TO RELATED APPLICATIONS

This application claims priority to Korean Patent Application No. 10-2023-0027687, filed on Mar. 2, 2023, which is incorporated herein by reference in its entirety.

BACKGROUND

Technical Field

The present disclosure relates to a water-repellent coating lens applied to a vehicle camera lens and a manufacturing method thereof.

Description of Related Art

A camera system for a vehicle is a system for providing driving and parking convenience by providing an image of the vehicle's surroundings, and it is required to provide clear images even in various environments. In particular, when a vehicle travels on a wet road caused by rain, snow, or the like, contamination may occur on the camera lens due to water, muddy water, etc., resulting in a problem in visibility.

In order to prevent this, a coating performing a water-repellent function is applied to the surface of the camera lens to reduce the adhesion probability of contaminants such as water droplets or the like.

A fluorine-based coating is applied as a conventional water-repellent coating, and it is a technique which has excellent water-repellent performance, high visible light transmittance, weatherability, etc., and becomes a great help in securing visibility even in environmental conditions such as rain.

However, as car washing and lens contamination cleaning due to vehicle contamination are repeated, the coating is damaged or the water repellent function is lost, so it is required to further secure long-term durability.

In addition, when a strong basic chemical is applied among detergents used for car washing and cleaning, a problem of damaging not only the applied water repellent coating but also the low reflection coating may occur.

When these coating layers are damaged, the provided image quality deteriorates, making it impossible to maintain marketability.

In addition, as autonomous driving technology develops, cameras tend to have a function of recognizing surrounding objects in addition to a simple function of providing images, and when the image quality deteriorates, the recognition function also deteriorates, and thus this may lead to driving safety problems.

The contents described in the above Description of Related Art are to aid understanding of the background of the present disclosure and may include what is not previously known to those having ordinary skill in the art to which the present disclosure pertains.

SUMMARY

The present disclosure has been made to solve the above-described problems, and an object of the present disclosure is to provide a water-repellent coating lens for a camera, which has enhanced abrasion resistance performance and chemical resistance performance of the water-repellent coating, and a manufacturing method thereof.

A water-repellent coating lens for a camera according to one aspect of the present disclosure includes a lens base layer and a plurality of coating layers deposited on the lens base layer. The plurality of coating layers include a first water-repellent coating layer containing a fluorine-based compound and a second water-repellent coating layer positioned on the bottom surface of the first water-repellent coating layer and containing an inorganic oxide.

Here, the second water-repellent coating layer is a rare earth oxide.

Furthermore, the second water-repellent coating layer is a cerium oxide ($CeO_2$) or a hafnium oxide ($HfO_2$).

In addition, the second water-repellent coating layer is formed by electron-beam evaporation at a temperature in a range of 300 to 400° C. and a vacuum degree in a range of $1.0 \times 10^{-5}$ torr to $2.0 \times 10^{-5}$ torr.

In addition, the second water-repellent coating layer has a thickness in a range of 25 nm to 100 nm.

Meanwhile, the first water-repellent coating layer includes one or more fluorine-based compounds such as perfluoropolyether (PFPE), polytetrafluoroethylene (PTFE), fluorinated ethylene propylene (FEP), a perfluoroalkyl vinyl ether copolymer, or a combination thereof. The first water-repellent coating layer further includes one or more silicone compounds such as octadecyltrimethoxy silane, octyltrimethoxy silane, methyltrimethoxy silane, ethyltrimethoxy silane, ethyltriethoxy silane, propyltrimethoxy silane, n-propyltriethoxy silane, isopropyltriethoxysilane, n-butyltrimethoxy silane, isobutyltrimethoxy silane, phenyltrimethoxysilane, N-(2-aminoethyl)-3-(aminopropyltrimethoxy silane), 3-mercaptopropyltrimethoxy silane, 3-mercaptopropyltriethoxy silane, 3-aminopropyltriethoxy silane, 3-aminopropyltrimethoxy silane, 3-(meth)acryloxypropyltrimethoxy silane, 3-(meth)acryloxypropyltriethoxy silane, phenylaminopropyltrimethoxysilane, vinyltriethyloxy silane, vinyltrimethoxy silane, allyltrimethoxy silane, or a combination thereof.

In addition, the first water-repellent coating layer has a thickness in a range of 10 to 40 nm as formed by electron-beam evaporation or thermal evaporation.

In addition, the water-repellent coating lens for a camera further includes a low-reflection coating layer deposited on the lens base layer, and the second water-repellent coating layer is deposited on the low-reflection coating layer. Here, the low-reflection coating layer is a multilayer film of 6 or 7 layers having alternating layers of an $SiO_2$ thin film and a $TiO_2$ thin film.

Next, a method for manufacturing a water-repellent coating lens for a camera according to one aspect of the present disclosure includes depositing a low-reflection coating layer on a lens base layer, and forming a double water-repellent coating layer including a first water-repellent coating layer and a second water-repellent coating layer on the low-reflection coating layer, wherein the first water-repellent coating layer contains a fluorine-based compound, and the second water-repellent coating layer contains an inorganic oxide.

Here, the second water-repellent coating layer is a rare earth oxide. Furthermore, the second water-repellent coating layer is cerium oxide ($CeO_2$) or hafnium oxide ($HfO_2$).

In addition, the forming of the double water-repellent coating layer includes the forming of the second water-repellent coating layer on the low-reflection coating layer by electron-beam evaporation and forming the first water-repellent coating layer on the second water-repellent coating layer by electron-beam evaporation or thermal evaporation.

Here, the forming of the second water-repellent coating layer is conducted by electron-beam evaporation at a temperature in a range of 300 to 400° C. and a vacuum degree in a range of $1.0 \times 10^{-5}$ torr to $2.0 \times 10^{-5}$ torr.

In addition, the first water-repellent coating layer has a thickness in a range of 10 nm to 40 nm, and the second water-repellent coating layer has a thickness in a range of 25 nm to 100 nm.

In addition, the depositing of the low-reflection coating layer forms a multilayer film of 6 or 7 layers by repeatedly alternating an $SiO_2$ thin film and a $TiO_2$ thin film on the lens base layer.

The water-repellent coating lens according to the present disclosure advantageously has more enhanced performance of abrasion resistance and chemical resistance while securing visible light transmittance by double coating a low-reflection coating layer with a rare earth oxide and a fluorine-based water repellent layer.

In other words, the initial water-repellent performance with a contact angle of 110 degrees or more is secured by a fluorine-based coating layer, and the water-repellent performance with a contact angle of 95 degrees or more can be maintained even after abrasion is progressed by the rare earth oxide, so that wear resistance and chemical resistance are further improved.

DETAILED DESCRIPTION

Figure 1:
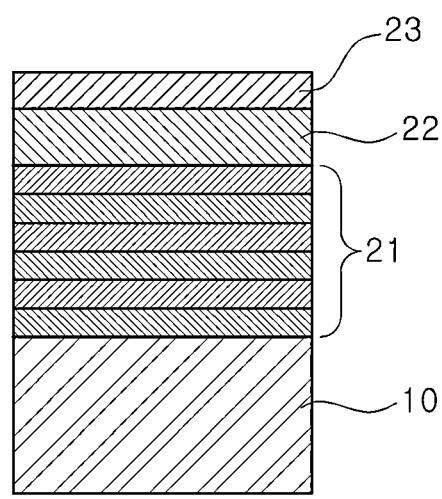
FIG. 1 shows a water-repellent coating lens according to an embodiment of the present disclosure.

In order to sufficiently understand the present disclosure, the advantages in operation of the present disclosure and the objects achieved by the practice of the present disclosure, reference should be made to the accompanying drawings illustrating certain embodiments of the present disclosure and the contents described in the accompanying drawings.

In describing the embodiments of the present disclosure, known techniques or repetitive descriptions thereof that may unnecessarily obscure the subject matter of the present disclosure are reduced or omitted.

Hereinafter, a water-repellent coating lens for a camera according to one embodiment of the present disclosure is described with reference to the accompanying drawings.

A water-repellent function is realized by using a conventional fluorine-based coating alone.

The fluorine-based coating includes perfluoropolyether (PFPE), performing a water-repellent function, and a silane or siloxane-based binder, performing a function of attaching the polymer chain to the base material.

PFPE is a chemically very stable compound, and the fluorine-based coating is a technology that increases weather resistance by increasing bonding strength using an inorganic binder.

However, even if this technology is applied, there is a limit in that it is difficult to secure physical durability. In addition, there are limits in that the fluorine-based coating is easily damaged when exposed to strong basic chemicals, and the fluorine-based coating cannot protect the base material layer.

The present disclosure is to maintain a water repellent function and reinforce a low-reflection coating layer protecting function by introducing an inorganic oxide to reinforce the abrasion resistance and chemical resistance properties of a camera lens to which such an existing coating method is applied.

To this end, the water-repellent coating lens according to the present disclosure is formed by depositing a low-reflection coating layer 21 for securing transmittance on a lens base layer 10 made of glass material, and depositing and forming a double water-repellent coating layer of a first water-repellent coating layer 23 and a second water-repellent coating layer 22 on the low-reflection coating layer 21.

The water-repellent coating lens is characterized in that the uppermost first water-repellent coating layer 23 is a coating layer containing a fluorine-based compound, and a rare earth oxide is applied as an inorganic oxide of the second water-repellent coating layer 22.

The rare earth oxide has water-repellent performance with low surface energy while having excellent mechanical strength, and has the characteristics of being able to manufacture a transparent coating layer depending on the thickness.

In other words, the existing low reflection-water repellent coating design is changed to a low reflection-rare earth oxide-water repellent coating design, and the structure of the low-reflection coating layer considering the thickness of the rare earth oxide is also changed in order to reinforce visible light transmittance.

Through this, the water-repellent coating lens has water-repellent performance having a contact angle of 110 degrees or more in the initial state by the fluorine-based coating layer, which is the first water-repellent coating layer 23, and secures wear resistance properties capable of maintaining a contact angle of 95 degrees or more even during long-term wear resistance by the rare earth oxide, which is the second water-repellent coating layer 22.

In addition, even when exposed to strong basic chemicals, a rare earth oxide acts as a protective layer to enable damage to the low-reflection coating layer to be suppressed.

As the fluorine-based coating layer, which is the first water-repellent coating layer 23, a multilayer thin film may be used in which a fluorine layer and silicon compound layers are combined in a complex manner. The fluorine layer may include perfluoropolyether (PFPE), polytetrafluoroethylene (PTFE), fluorinated ethylene propylene (FEP), perfluoroalkyl vinyl ether copolymer, or a combination thereof. The silicon compound layers may include octadecyltrimethoxy silane, octyltrimethoxy silane, methyltrimethoxy silane, ethyltrimethoxy silane, ethyltriethoxy silane, propyltrimethoxy silane, n-propyltriethoxy silane, isopropyltriethoxysilane, n-butyltrimethoxy silane, isobutyltrimethoxy silane, phenyltrimethoxysilane, N-(2-aminoethyl)-3-(aminopropyltrimethoxy silane), 3-mercaptopropyltrimethoxy silane, 3-mercaptopropyltriethoxy silane, 3-aminopropyltriethoxy silane, 3-aminopropyltrimethoxy silane, 3-(meth)acryloxypropyltrimethoxy silane, 3-(meth)acryloxypropyltriethoxy silane, phenylaminopropyltrimethoxysilane, vinyltriethyloxy silane, vinyltrimethoxy silane, allyltrimethoxy silane, or a combination thereof.

Next, the selection of the second water-repellent coating layer 22 is described in more detail. First, an oxide having a low surface energy is selected as a candidate material for implementing water-repellent performance from inorganic oxides in order to reinforce wear resistance.

Candidate materials for use in camera lenses should be selected as materials that are transparent, and have excellent strength and low surface energy.

The water repellency and abrasion resistance were intended to be checked on three types of $ZrO_2$, $CeO_2$, and $HfO_2$, and the surface energies of the corresponding rare earth oxides and the like are shown in the table below.

TABLE 1

| Type | Surface Free Energy (mJ/m$^2$) |
|---|---|
| Glass | 250~500 |
| PTFE | 18 |
| SiO$_2$ | 50~70 |
| ZrO$_2$ | 40~50 |
| CeO$_2$ | 30~40 |
| HfO$_2$ | 30~40 |

In addition, as a result of the study, it was confirmed that a contact angle of 100 degrees or more was secured for a rare earth oxide under specific manufacturing conditions, but there has been a problem in that DC sputtering method, or electron-beam evaporation under high temperature (500 to 700° C.) and high vacuum ($1.0 \times 10^{-6}$ torr) conditions has to be used.

It should be coated to a thickness of several hundred μm, but if the method under the above conditions is used, an excessive cycle time is required, resulting in an increase in manufacturing cost.

Therefore, the present disclosure aims to reduce the increase in manufacturing cost by performing coating under low temperature/low vacuum conditions by electron-beam evaporation. The low-temperature and low-vacuum conditions of the present disclosure are compared with the conventional ones as shown in the following table.

TABLE 2

| | Process conditions | | |
|---|---|---|---|
| | Temperature (° C.) | Degree of vacuum (torr) | Deposition rate (Å/s) |
| Existing technology | 500 to 700 | $1.0 \times 10^{-6}$ or less | 0.3 to 1.0 |
| The present disclosure | 300 to 400 | $1.0 \times 10^{-5}$ to $2.0 \times 10^{-5}$ | 1.0 to 3.0 |

If the deposition temperature is less than 300° C., shortfall of the initial contact angle occurs, and a decrease in the contact angle after anti-wear test occurs, and if the deposition temperature exceeds 400° C., the cost and time in the manufacturing process increase, making it unsuitable.

When the deposition rate is less than 1 Å/s, a long manufacturing process time is required, and when the deposition rate exceeds 3 Å/s, shortfall of an initial contact angle occurs, and a decrease in the contact angle after anti-wear test occurs.

Further, the thickness of the coating layer may be in a range of 25 nm to 100 nm. If the thickness is less than 25 nm, the decrease amount of the contact angle after anti-wear test increases, and if the thickness exceeds 100 nm, the transmittance decreases.

The wear resistance properties of the three inorganic oxide coatings prepared in this way and the fluorine-based coating, which is an existing technology, were compared.

The anti-wear test was conducted with a reciprocating friction tester, and the detailed conditions are as follows.

TABLE 3

| Items | Load | Friction counterpart | Friction distance | Speed | Times |
|---|---|---|---|---|---|
| Conditions | 4.9N | Double-sided canvas duck #10 | 100 mm | 20 times/minute | 4500 |

Figure 2:
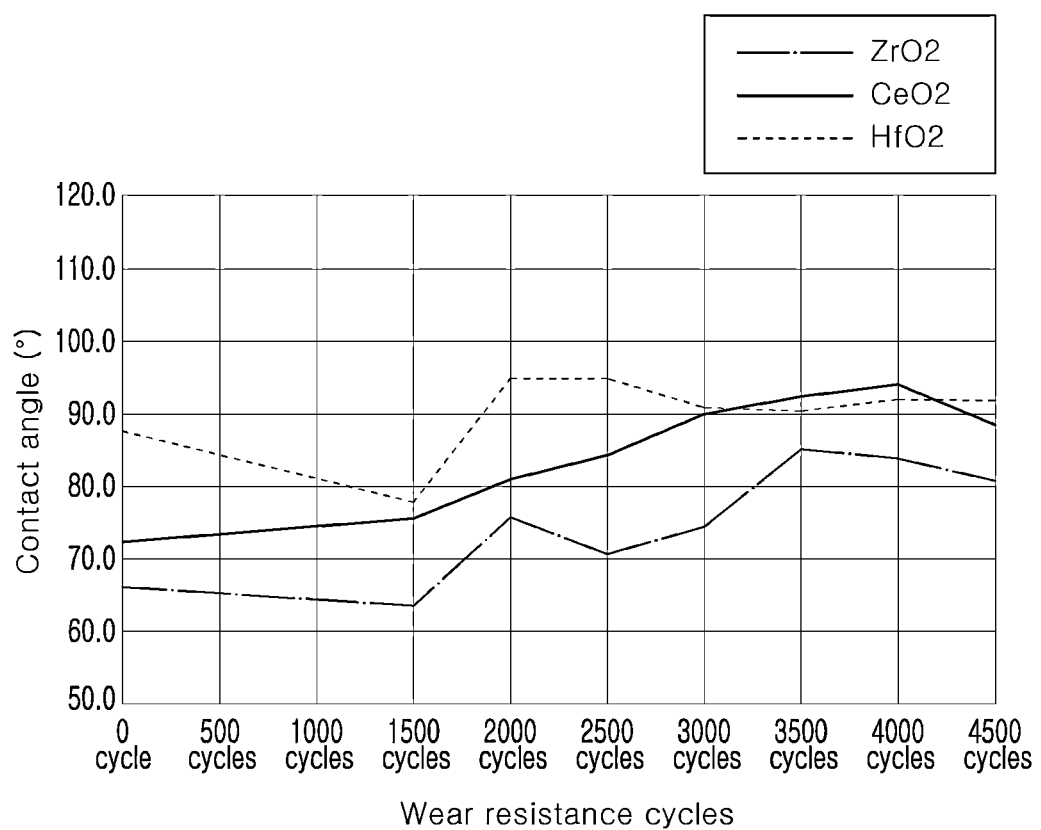
FIG. 2 is evaluation results of abrasion resistance by inorganic oxides according to an embodiment of the present disclosure.

As a result, as shown in FIG. 2, in the case of three types of inorganic oxides, the initial contact angle was shown to be insufficient, but as wear progressed, it was confirmed that the characteristics of the material maintaining the contact angle were expressed.

In certain examples, cerium oxide ($CeO_2$) and hafnium oxide ($HfO_2$) may be applied as the second water-repellent coating layer 22, as these compounds have relatively excellent water-repellent performance.

Figure 3:
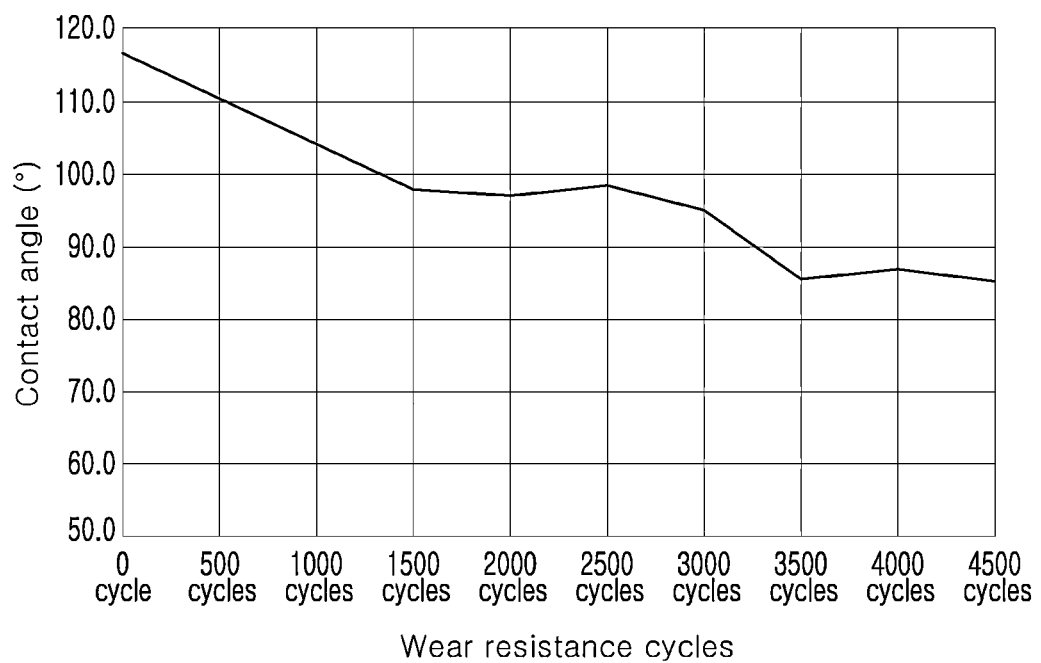
FIG. 3 is an evaluation result of abrasion resistance by a fluorine-based coating layer according to an embodiment of the present disclosure.

On the other hand, in the case of the fluorine-based coating as shown in FIG. 3, the initial contact angle was excellent, but it could be confirmed that the function deteriorated continuously while wear progressed.

Therefore, in order to solve an initial performance problem of the inorganic oxide coating and a problem in the lack of wear resistance performance of the fluorine-based coating, the present disclosure is intended to overcome the problems by using a double water-repellent coating.

Figure 4:
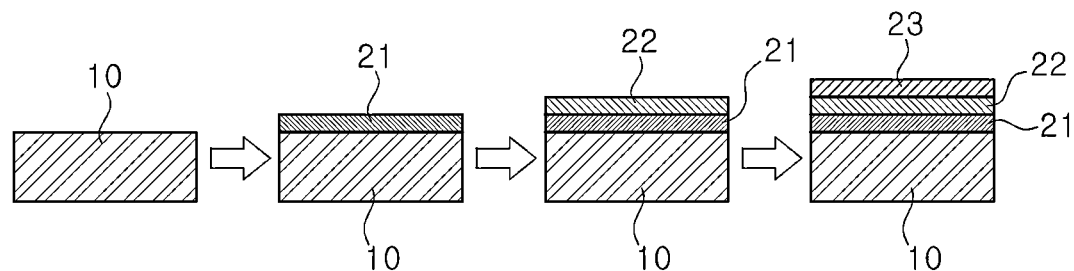
FIG. 4 shows the manufacturing process of the water-repellent coating lens according to an embodiment of the present disclosure.

As shown in FIG. 4, a low-reflection coating layer 21 to be described later was deposited on the lens base layer 10, a rare earth oxide exhibiting the above characteristics among inorganic oxides was first selected as a double water-repellent coating layer to first manufacture it into a second water-repellent coating layer 22, which is a lower layer of the water-repellent coating layer, and then the first water-repellent coating layer 23, which is a fluorine-based coating layer, was manufactured as an upper layer so that initial water-repellent performance and wear resistance properties were intended to be secured.

Table 4 is the coating conditions of the low-reflection coating layer 21, and the coating conditions of the second water-repellent coating layer 22 are as shown in Table 2 above, and Table 5 shows the coating conditions of the first water-repellent coating layer 23.

TABLE 4

| Process conditions | Low-reflection coating layer |
|---|---|
| Temperature (° C.) | 80 to 150 |
| Degree of vacuum (torr) | $2.0 \times 10^{-5}$ to $3.0 \times 10^{-5}$ |
| Deposition rate (Å/s) | 2.5 to 3.5 |

TABLE 5

| Process conditions | First water-repellent coating layer |
|---|---|
| Temperature (° C.) | 80 to 90 |
| Degree of vacuum (torr) | $2.5 \times 10^{-5}$ to $3.5 \times 10^{-5}$ |
| Deposition rate (Å/s) | 2.5 to 3.5 |

The fluorine-based coating layer may be formed by electron-beam or thermal evaporation, and may have a thickness in a range of 10 to 40 nm. If the thickness is less than 10 nm, the initial contact angle falls short, and premature wear occurs, and if the thickness is 40 nm or more, there is a limitation in that it is difficult to manufacture the fluorine-based coating layer.

Figure 5:
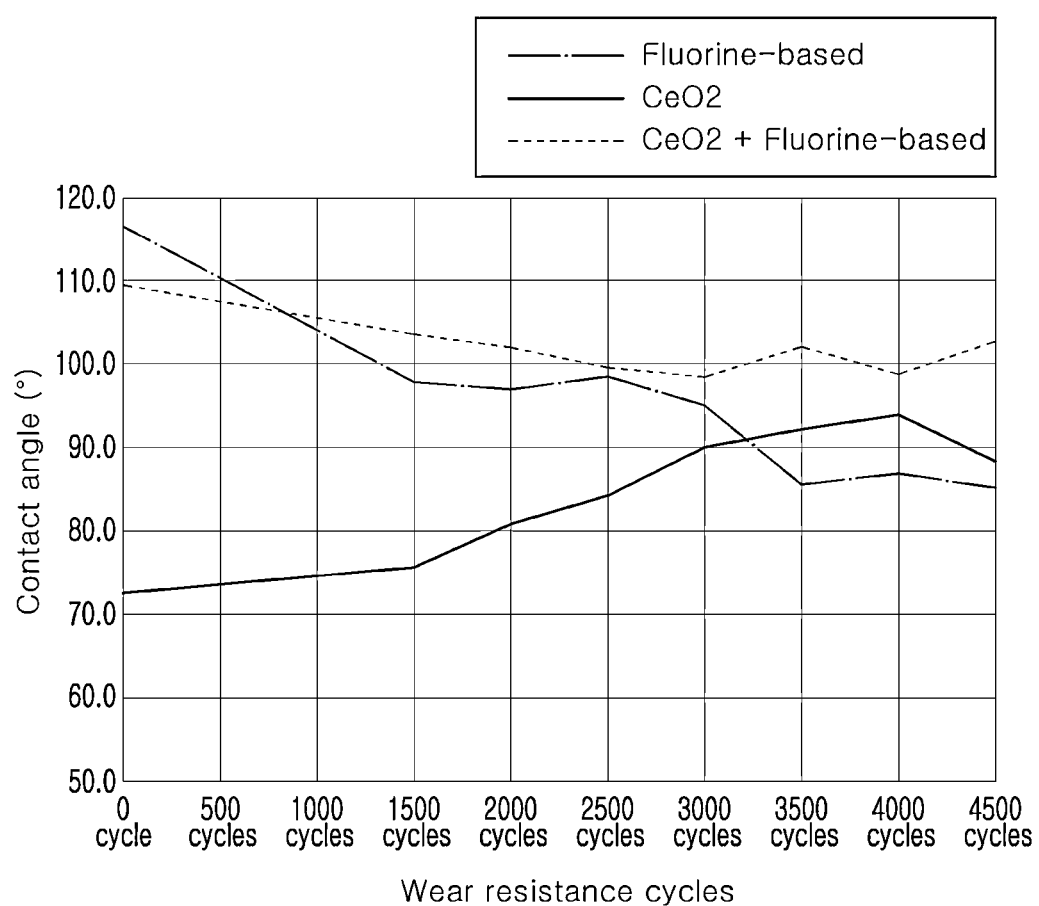
FIG. 5 is abrasion resistance evaluation results when coating a fluorine-based coating layer, an inorganic oxide single layer, and both thereof, according to an embodiment of the present disclosure.

As a result of the experiment, as shown in FIG. 5, it could be confirmed that the double water-repellent coating layer according to the present disclosure to which $CeO_2$ was applied had excellent abrasion resistance.

Figure 6:
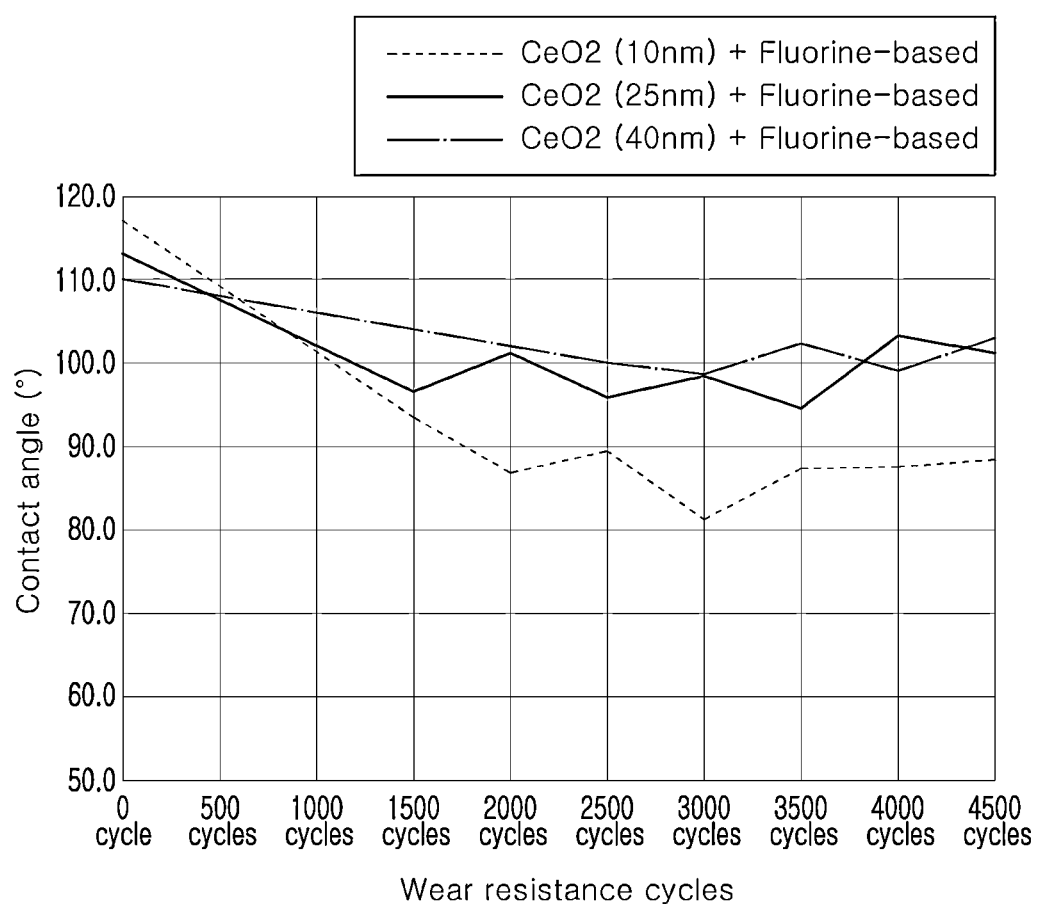
FIG. 6 is abrasion resistance evaluation results for each thickness when coating both of a fluorine-based coating layer and an inorganic oxide according to an embodiment of the present disclosure.

In addition, as shown in FIG. 6, as a result of comparing the wear resistance properties of each thickness of $CeO_2$, it was confirmed that the properties were expressed at 25 nm or more.

Figure 7:
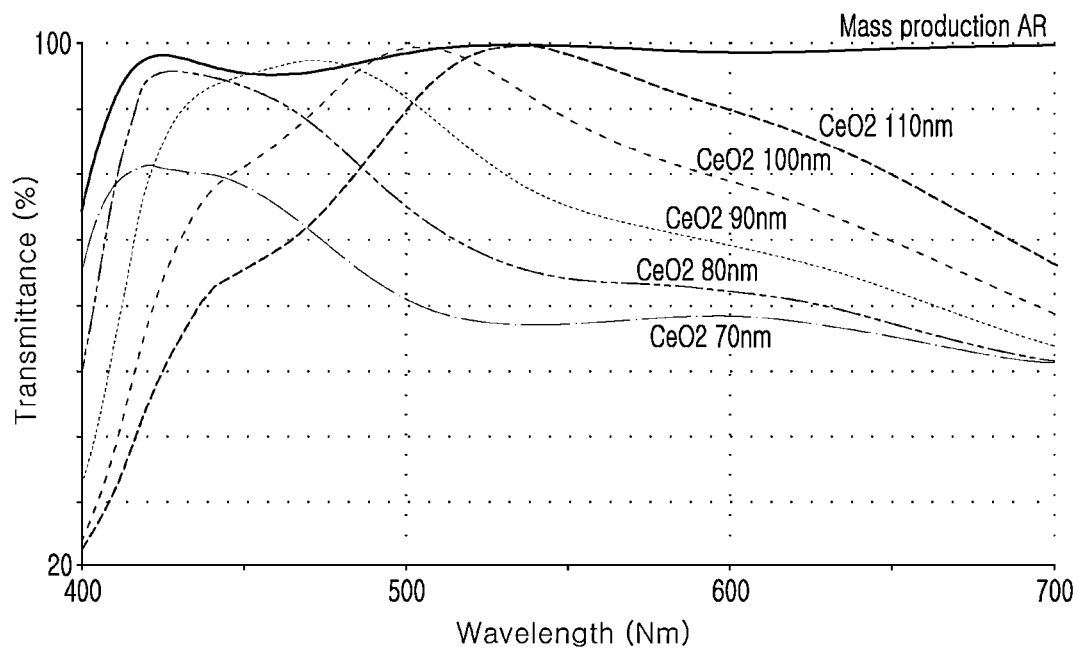
FIG. 7 is transmittance characteristics for each wavelength according to the thickness of an inorganic oxide.

Basically, rare earth oxides are transparent materials at thin thickness. However, as can be seen in FIG. 7, the overall transmittance is only at a level in a range of 50 to 70%, and in particular, the absorption properties vary according to the wavelength of light. Even in the case of the rare earth oxide selected in the present disclosure, the color appears similarly depending on the absorption/reflection wavelength band.

In order to be used in a camera lens, uniformly high transmittance should be secured in the entire wavelength range of visible light.

This is a problem in that it is difficult to obtain the camera lens by using only the corresponding material, and the low-reflection coating layer should be redesigned according to the corresponding material.

However, in order to obtain a uniform transmittance as a whole even if it is designed from as few as several layers to as many as dozens of layers, the transmittance properties of the corresponding material should be the basis. Since this is a part that reflects both the material's own properties and the thickness factor, the target level can be obtained only when an appropriate thickness is selected.

Therefore, the low-reflection coating layer 21 according to the present disclosure employs a low-reflection coating layer having a structure of 6 or 7 layers in which $SiO_2$—$TiO_2$ thin films are repeatedly alternated.

Figure 8:
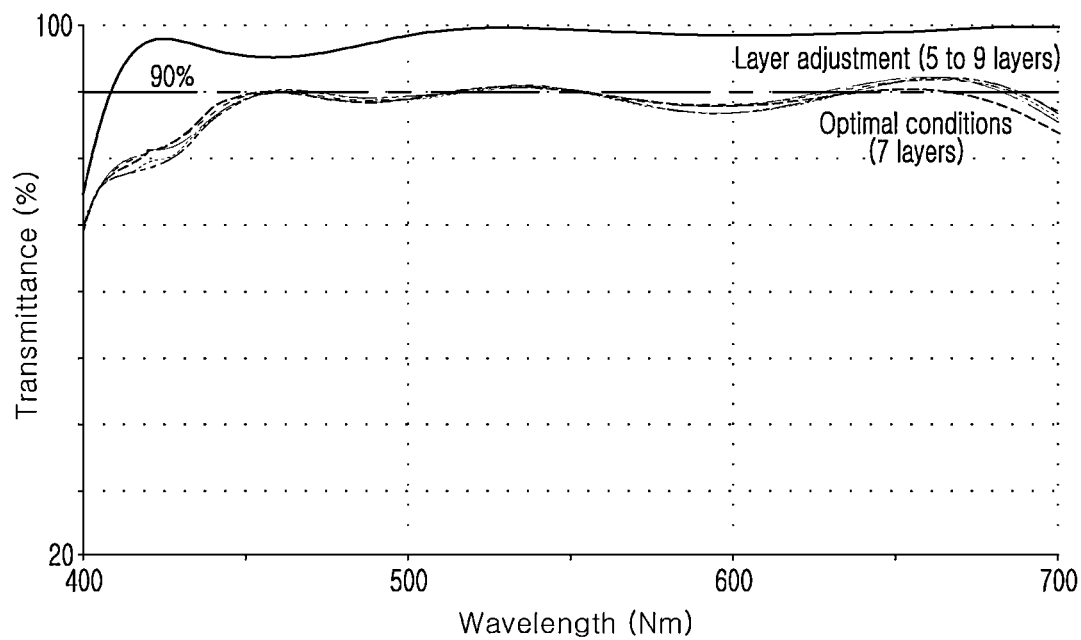
FIGS. 8 and 9 illustrate transmittances according to design examples of the low-reflection layer when an inorganic oxide is applied for each thickness, according to an embodiment of the present disclosure.
Figure 9:
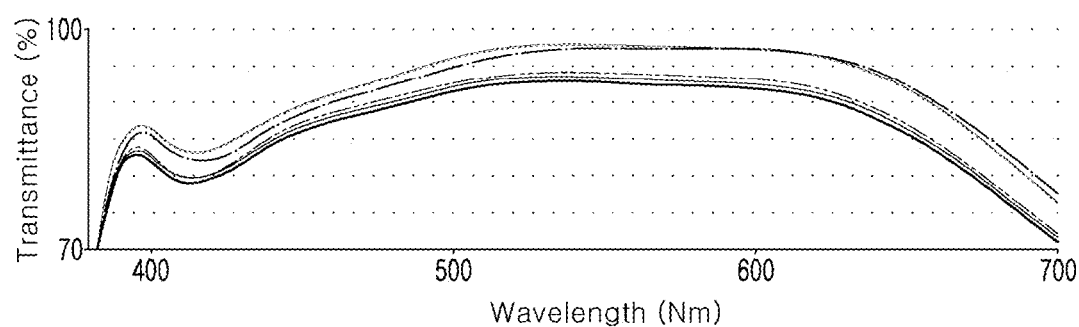

FIGS. 8 and 9 illustrate transmittances according to the design of the number of layers of the low-reflection layer when an inorganic oxide is applied and are the results when 5 to 9 layers are implemented. FIG. 8 is the transmittance when $CeO_2$ is applied at 100 nm, and FIG. 9 is the transmittance when $CeO_2$ is applied at 75 nm. It could be confirmed that the transmittance of the 7th layer was the best in FIG. 8, and it could be confirmed that the transmittance of the 6th layer was the best in FIG. 9. Examples of the thickness of each thin film of the low-reflection coating layer 21 under optimal conditions of FIGS. 8 and 9 are as shown in the following table.

TABLE 6

| Materials | Thickness (nm) | Thickness (nm) |
|---|---|---|
| $CeO_2$ | 100.0 | 75.0 |
| $SiO_2$ | 177.1 | — |
| $TiO_2$ | 43.4 | 27.8 |
| $SiO_2$ | 17.8 | 169.5 |
| $TiO_2$ | 41.0 | 115.5 |
| $SiO_2$ | 61.3 | 42.9 |
| $TiO_2$ | 11.6 | 17.2 |
| $SiO_2$ | 60.6 | 40.2 |

Figure 10:
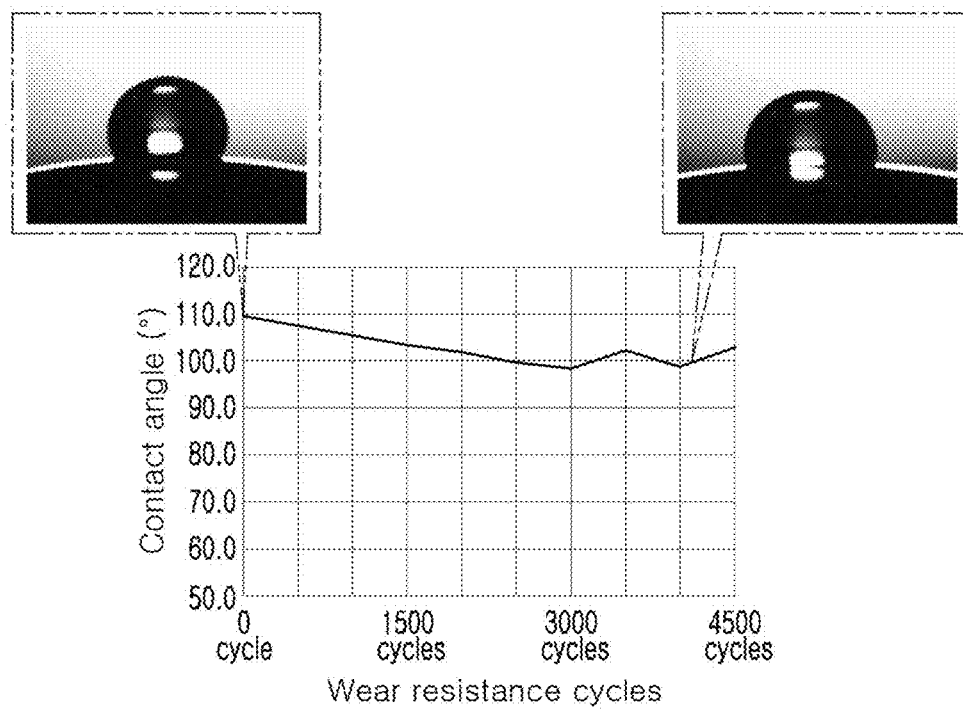
FIG. 10 shows contact angle states due to abrasion of the water-repellent coating lens according to an embodiment of the present disclosure.

As described above, the water-repellent coating lens according to the present disclosure is formed of a low-reflection coating layer—a water-repellent coating layer of a rare earth oxide—a fluorine-based water-repellent coating layer, so that it can maintain a transmittance of a 90% level, and as referenced in FIG. 10, water-repellent performance of a contact angle level of 110 degrees and high durability of 100 degrees or more even after abrasion resistance.

While the present disclosure has been described with reference to the accompanying drawings, it will be apparent to those having ordinary skill in the art that various changes and modifications can be made without departing from the spirit and scope of the present disclosure without being limited to the embodiments disclosed herein. Accordingly, it should be noted that such alternations or modifications fall within the claims of the present disclosure, and the scope of the present disclosure should be construed on the basis of the appended claims.

EXPLANATION OF REFERENCE NUMERALS

10: Lens base layer
21: Low-reflection coating layer
22: Second water-repellent coating layer
23: First water-repellent coating layer

What is claimed is:

1. A method for manufacturing a water-repellent coating lens for a camera, the method comprising:
   depositing an anti-reflection coating layer on a lens base layer; and
   forming a double water-repellent coating layer comprising a first water-repellent coating layer and a second water-repellent coating layer on the anti-reflection coating layer,
   wherein the first water-repellent coating layer contains a fluorine-based compound, and
   wherein the second water-repellent coating layer contains an inorganic oxide,
   wherein the forming of the double water-repellent coating layer comprises
      forming the second water-repellent coating layer on the anti-reflection coating layer by electron-beam evaporation, and
      forming the first water-repellent coating layer on the second water-repellent coating layer by electron-beam evaporation or thermal evaporation such that the second water-repellent coating layer is positioned between the anti-reflection coating layer and the first water-repellent coating layer,
   wherein the forming of the second water-repellent coating layer is by electron-beam evaporation at a temperature in a range of 300 to 400° C. and a vacuum degree in a range of $1.0 \times 10^{-5}$ torr to $2.0 \times 10^{-5}$ torr.

2. The method of claim 1, wherein the second water-repellent coating layer comprises a rare earth oxide.

3. The method of claim 2, wherein the second water-repellent coating layer comprises cerium oxide ($CeO_2$) or hafnium oxide ($HfO_2$).

4. The method of claim 1, wherein the first water-repellent coating layer has a thickness in a range of 10 nm to 40 nm, and
   wherein the second water-repellent coating layer has a thickness in a range of 25 nm to 100 nm.

5. The method of claim 1, wherein the depositing of the anti-reflection coating layer comprises forming a multilayer film of 6 or 7 layers by repeatedly alternating depositing an $SiO_2$ thin film and a $TiO_2$ thin film on the lens base layer.

* * * * *